United States Patent [19]

Weaver et al.

[11] Patent Number: 4,546,342

[45] Date of Patent: Oct. 8, 1985

[54] DATA COMPRESSION METHOD AND APPARATUS

[75] Inventors: Charles S. Weaver, Palo Alto, Calif.; Robert A. LeBlanc, Montreal, Canada; Lawrence E. Sweeney, Jr., Atherton, Calif.

[73] Assignee: Digital Recording Research Limited Partnership, Menlo Park, Calif.

[21] Appl. No.: 561,723

[22] Filed: Dec. 14, 1983

[51] Int. Cl.[4] .......................................... H03K 13/00
[52] U.S. Cl. ............................ 340/347 DD; 360/32; 375/122
[58] Field of Search .................... 360/32; 375/31, 122, 375/32; 381/29–35; 340/347 AD, 347 DD; 358/261

[56] References Cited

U.S. PATENT DOCUMENTS

| | | | |
|---|---|---|---|
| 3,588,836 | 6/1971 | Frazier | 360/32 |
| 3,750,024 | 7/1973 | Dunn | 375/31 |
| 3,949,299 | 4/1976 | Song | 375/122 |
| 4,185,302 | 1/1980 | Mounts | 358/261 |
| 4,272,648 | 6/1981 | Agrawal | 381/31 |

OTHER PUBLICATIONS

Ruttimann "IEEE Transactions on Biomedical Engineering" vol. BME-26, No. 11, pp. 613–623, Nov. 1979.

Ripley "Pro. Comput. Cardiol." 1976, pp. 439–445.

*Primary Examiner*—Charles D. Miller
*Attorney, Agent, or Firm*—Victor R. Beckman

[57] ABSTRACT

A music data compression system is disclosed which includes an analog to digital converter for converting the analog music signal to digital sample signal form, a digital compression filter for compression filtering the digital sample signals, and an encoder for truncated Huffman encoding the compression filter output. An entropy setting unit is included in the system for step control of the signal supplied to the digital compression filter in accordance with one or more threshold levels of the envelope of the music signal, and for reducing the entropy of the signal with increases in the energy level of the music signal. Different codes may be implemented in accordance with the threshold(s), and an identifying code word is inserted in the Huffman encoded stream. A decoder, digital reconstruction filter, and digital to analog converter are used to reconstruct the analog music signal. The identifying code word in the encoded signal stream to the decoder is used to select the necessary algorithm for decoding, and an entropy setting unit is included for step control of the gain of the digital reconstruction filter output under control of the identifying code word when step gain control is included prior to compression filtering.

44 Claims, 13 Drawing Figures

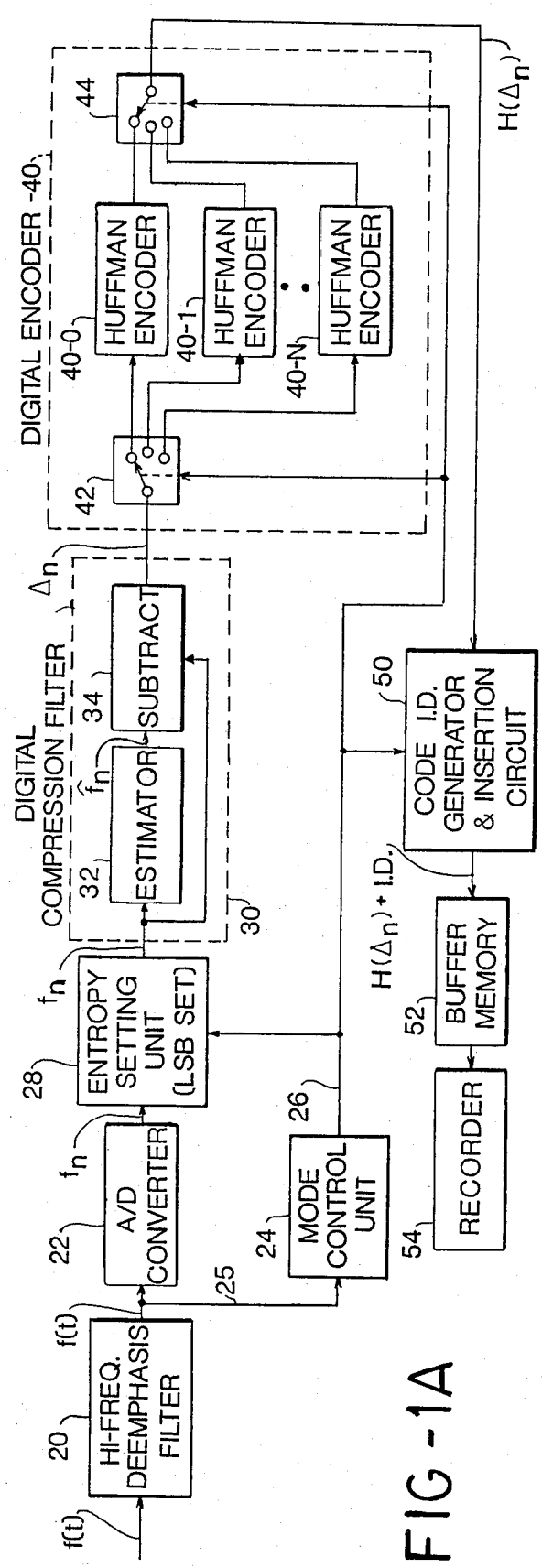
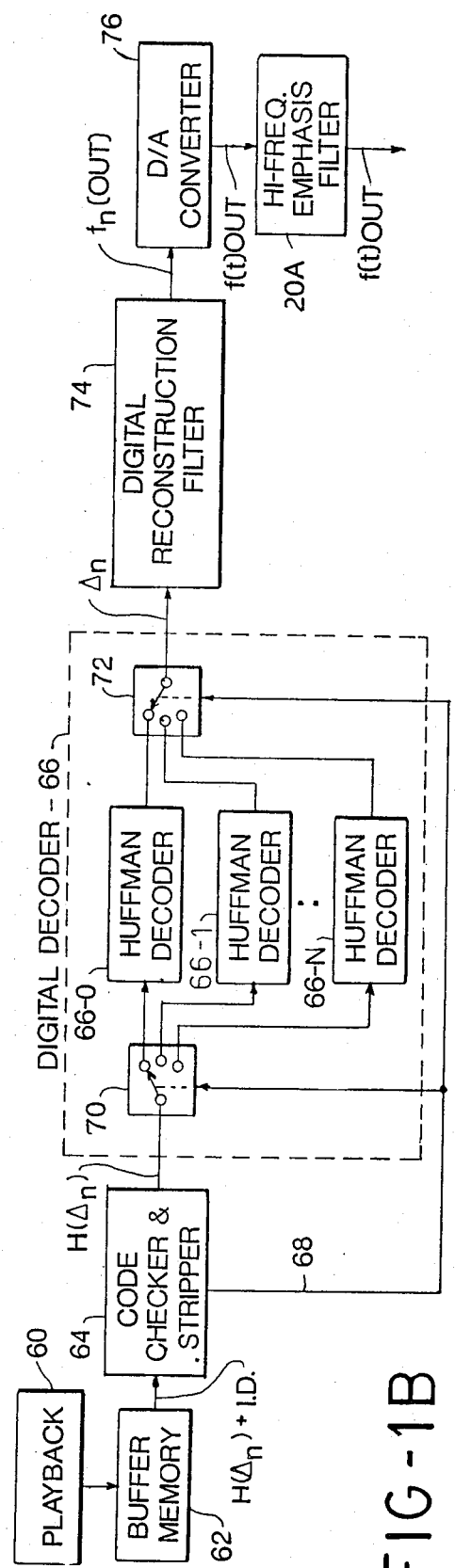
FIG-1A
FIG-1B

DATA COMPRESSION METHOD AND APPARATUS

BACKGROUND OF THE INVENTION

Systems which include means for converting analog signals to digital sample signals, digital compression filter means for reducing the entropy of the sample signals, and Huffman encoding means for encoding the output from the digital compression filter in preparation for recording and/or transmission to a remote location, together with a playback or receiver means, Huffman decoding means, digital reconstruction means which is the exact or nearly exact inverse of the digital compression filter means, and means for converting the decoded and filtered digital signals back to analog form are disclosed in an article by U. E. Ruttimann and H. V. Pipberger entitled, "Compression of the ECG by Prediction or Interpolation and Entropy Encoding", *IEE Transactions on Biomedical Engineering*, Vol. BME-26, No. 11, pp. 613–623, November 1979. A similar system is shown in an article by K. L. Ripley and J. R. Cox, Jr. entitled, "A Computer System for Capturing Transient Electrocardiographic Data", *Pro. Comput. Cardiol.* pp. 439–445, 1976. The present invention is directed to method and means for further reducing the entropy of the digital sample signal prior to recording and/or transmission thereof.

SUMMARY OF THE INVENTION

The present invention is particularly adapted for use in the compression of audio analog signals, such as music signals. The analog music signals typically are converted to 14 to 16 bit sample signals by analog to digital conversion which provides for small quantization levels. For very low level music signals such small quantization levels are necessary, but with moderately high level signals, the ear is incapable of resolving the waveform down to such levels i.e. from one part in approximately 16,000 to one part in approximately 65,000. That is, the quantization level where distortion is noticeable to the listener is higher when the music level is higher. Experiments have shown that, depending upon the music level, the word length may be reduced to as low as 8 bits with no, or extremely small amount of noticeable distortion. It will be apparent that greater signal compression is possible with shorter sample signals.

The present invention is directed to an arrangement for changing the "effective" word length for different average music levels. With this invention, the average music energy level is measured as by means of an envelope detector, and the detector output is sensed by one or more thresholds. In one embodiment of the invention, one or more least significant bits (LSB) of the sample signal are set to a predetermined value, i.e. to 1 or 0, when the threshold(s) is exceeded as for example by truncation, round-off, a table look-up procedure, or the like, thereby effectively reducing the entropy of sample signals when the music level increases. These sample signals are supplied to a digital compression filter to generate signals whose entropy is less than the entropy of the input signals. When the LSBs are set to 1 or 0 the output entropy is further reduced. The compressed signals are supplied to an encoder for truncated Huffman encoding thereof. The digital output from the encoder is recorded by digital recording means, and/or transmitted to a remote receiving location. At a playback unit or receiving station the encoded music signal is decoded by decoder means, and the decoded signal is supplied to a digital reconstruction filter which is substantially an inverse of the compression filter. Digital to analog converter means converts the reconstruction filter output to analog form.

In a modified form of this invention, different Huffman codes may be employed for encoding the compression filter output, the code employed being dependent upon the threshold signal. The code employed is selected for minimizing the average bit rate of the Huffman encoded signal. With this arrangement, a code identification word is inserted in the signal stream from the encoder to identify the code which is being employed at the time. At playback, the code identification word is used to select the proper operating mode of the Huffman decoding means.

In another modified form of this invention variable gain circuits are included in the recording and playback systems for controlling input signal levels to the digital compression filter means and from the digital reconstruction filter means in accordance with the threshold signals. Either analog or digital gain control circuitry may be employed. This form of the invention also may be used with a plurality of different Huffman codes for different encoding of the sample signals dependent upon the threshold signals.

In yet another modified form of this invention, the setting of LSBs, or the setting of variable gain circuits at the input to the digital compression filter means, is controlled by means responsive to the average music energy level at the output from the digital compression filter. With this arrangement, different Huffman codes are employed for encoding the compression filter output dependent upon of the number of LSBs which are set to zero, or the gain setting. Code identification words are inserted in the Huffman encoded signal stream for use at playback for correct decoding of the signal stream.

BRIEF DESCRIPTION OF THE DRAWINGS

The invention will be better understood from the following description when considered with the accompanying drawings. In the drawings, wherein like reference characters refer to the same parts in the several views:

FIGS. 1A and 1B together show a block diagram of a data reduction system; a digital recording section being shown in FIG. 1A and playback section being shown in FIG. 1B;

RECORDING SYSTEM

Figure 2:
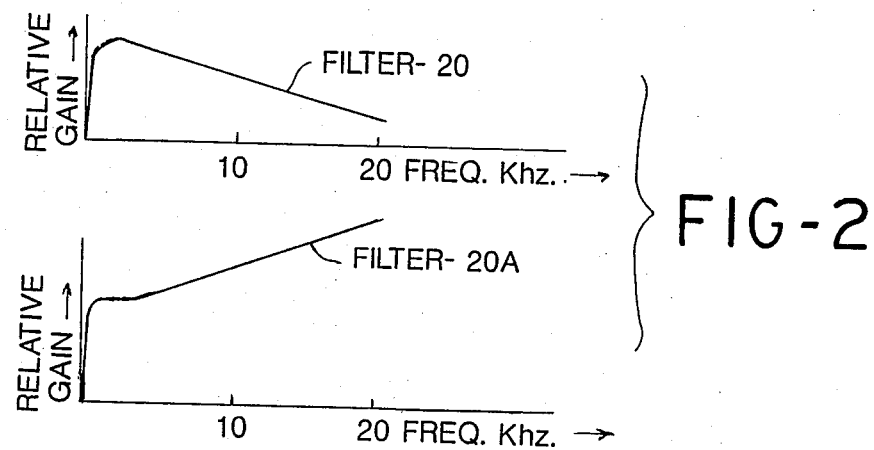
FIG. 2 shows the frequency response of high frequency deemphasis and emphasis filters included at the input and output, respectively, of the data reduction system.

Reference first is made to FIG. 1A wherein a recording unit of a combination recording-playback system embodying the present invention is shown comprising a high frequency deemphasis filter 20 to which an analog input signal f(t), such as a music signal, is supplied. The filter 20 deemphasizes the high frequency portion of the analog signal to reduce the signal entropy. The frequency response of filter 20 together with the frequency response of filter 20A included in the playback portion of the system is shown in FIG. 2. There, it will be seen that the relative gain of the filter 20 decreases beginning at approximately 0.4 KHz, to deemphasize high frequency components of the analog signal. For simplicity, the analog output from filter 20, as well as the analog input thereto, is identified as f(t). At A of FIG. 3, an analog signal f(t) is shown, comprising a music signal which may range in frequency from approximately 15 to 20,000 Hz.

Figure 3:
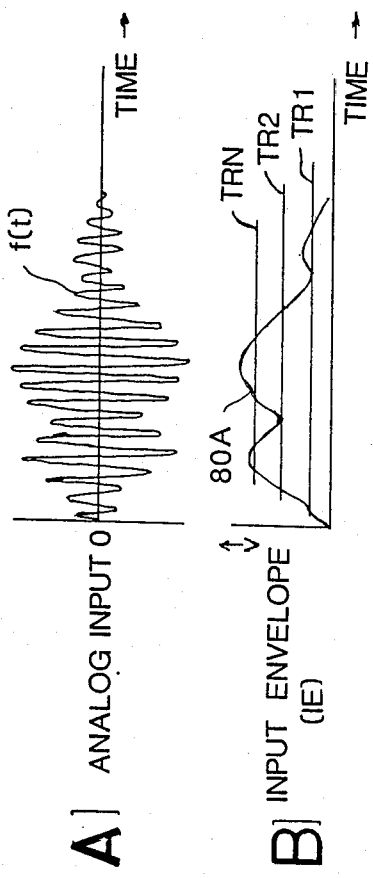
FIG. 3 shows a waveform and graphic representations of signals appearing at various locations in the data compression system shown in FIGS. 1A and 1B.
Figure 3:
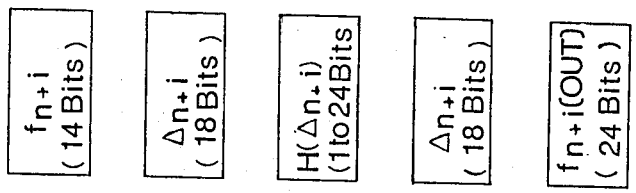

The filter 20 output is supplied to an analog to digital converter (A/D converter) 22 for conversion of the analog signal into digital form, the $n^{th}$ sample from the A/D converter being identified as $f_n$. The form of the A/D converter output, shown at C of FIG. 3, comprises samples $f_{n-1}$ through $f_{n+i}$ of equal length words. The A/D converter 22 operates in a conventional manner at a fixed sampling rate and fixed word length output. As noted above, A/D conversion word length typically is 14 to 16 bits and, for purposes of illustration only, a 14 bit word length is shown in FIG. 3. Also, for purposes of description only, a sampling rate of, say, 44 Khz may be employed for conversion of the analog music signal.

The output from the high frequency deemphasis filter 20 also is supplied to a mode control unit 24 over line 25 which, as described in detail hereinbelow generates mode control signals at output 26 therefrom for step control of several elements of the data compression circuit. Mode control signals at output 26 are dependent upon the average energy level of the music signal input to the unit.

The output from A/D converter 22 is supplied to an entropy control circuit 28 which, in the illustrated system comprises means for setting one or more of the least significant bits of the sample signal supplied thereto to a predetermined value of 1 or 0. A mode control signal from mode control unit 24 is supplied to the entropy control circuit 28 for controlling the setting of the least significant bits. For low level input signals, sample signals pass unaltered through circuit 28. At a first threshold level of the analog input envelope, the least significant bit may be set to 0, for example; at a second threshold level, the two least significant bits may be set to 0;1 etc. The operation of setting least significant bits to zero in response to mode control signals is described in greater detail following a description of the mode control unit 24. For simplicity, in FIG. 1A, the output from entropy control unit 28 is identified as $f_n$ the same as the input thereto.

The output from the entropy setting unit 28 is supplied to a compression filter 30 which, for present purposes, is shown to include an estimator 32 and subtracting means 34. The estimator 32 provides an estimate of $f_n$, here identified as $\hat{f}_n$, based upon actual samples occuring both before and after the sample $f_n$ to be estimated. Estimators for providing such estimated $\hat{f}_n$ values are, of course, well known. A difference signal $\Delta_n$ is produced by the compression filter 30 comprising the difference between the actual signal input $f_n$ and the estimated signal value $\hat{f}_n$ by subtraction of the estimated value from the actual value at subtracting means 34, as follows:

$$\Delta_n = f_n - \hat{f}_n \tag{1}$$

In the graphic signal representation of the compression filter output, shown at D in FIG. 3, difference signals $\Delta_n, \Delta_{n+1}, \Delta_{n+2}, \ldots \Delta_{n+i}$ are shown.

It here will be understood that the present invention is not limited to use with the illustrated compression filter in which the output $\Delta_n$ comprises the difference between the actual signal input $f_n$ and an estimated value $\hat{f}_n$. Other compression filtering may be used in which the compression filter output $\Delta_n$ is not a direct function of the difference between the actual input $f_n$ and an estimated value thereof, $\hat{f}_n$. The use of the term "difference signal values $\Delta_n$", therefore, is intended to identify the output from any suitable digital compression filter which may be employed in the systems of the present invention.

Figure 4:
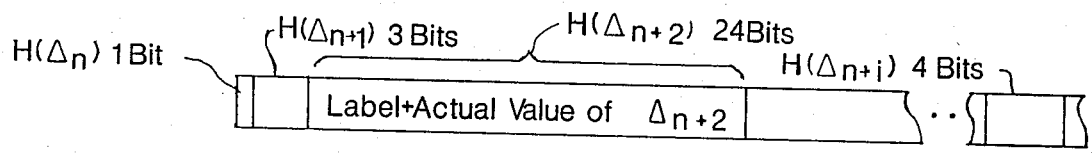
FIG. 4 is a graphic representation of encoded difference signals showing the format employed for encoding those difference signals which are outside a predetermined signal range.

The compressed signal values $\Delta_n$ are supplied to a digital encoder 40 for coding the same using a truncated Huffman code. Truncated Huffman encoding is, of course, well known. Briefly, the Huffman encoding technique makes use of the fact that the compression filter 30 has signal outputs, $\Delta_n$, having different probabilities of occurrence, and uses this fact to achieve a reduction in the total number of bits in the encoded signal over the input signal. A single code word is assigned to infrequently occurring compressed signals, and supplied as a label for the actual compressed signal value $\Delta_n$. In FIG. 1A, the encoder 40 output is designated $h(\Delta_n)$ and, at E in FIG. 3, the values $h(\Delta_n)$, $h(\Delta_{n+1})$, etc. represent encoded values of $\Delta_n, \Delta_{n+1}$, etc. The encoder 40 output comprises code words for the most frequently occurring values of $\Delta_n$, together a combined code word label and actual value of the compressed signal $\Delta_n$ for less frequently occurring values of $\Delta_n$. For purposes of illustration only, if the compressed signal $\Delta_n$ is outside the range of $-3$ to $+3$ then the actual signal $\Delta_n$ together with a code word label is produced at the encoder output. In FIG. 4, wherein several encoded values are shown, it will be seen that the encoded value for $\Delta_{n+2}$ comprises a label together with the actual compressed signal $\Delta_{n+2}$, wherein $\Delta_{n+2}$ comprises an infrequently occurring compression signal value; that is some value outside the range of ±3.

The digital compression filter 30 has a predetermined transfer function which is unaltered in the operation of the system. For example only, the compression filter may implement the following transform:

$$\Delta_n = f_{n+1} - 2f_n + f_{n-1} \tag{2}$$

However, the probability that particular signals $\Delta_n$ will be produced by the compression filter is dependent upon the setting of entropy setting unit 28. Therefore, in accordance with another aspect of the present invention, the Huffman code implemented by Huffman encoder 40 may be selected for maximum reduction in the length of encoded compressed signals produced thereby. In FIG. 1A, the digital encoder unit 40 is shown to include a plurality of individual encoders 40-0, 40-1 . . . and 40-N. Switches 42 and 44 at the inputs and outputs of the encoders select which encoder is employed during system operation. The switches 42 and 44 are under control of the output from mode control unit 24 for changing the Huffman code employed simultaneously with changes in the number of least significant bits which are set to a predetermined value by entropy setting unit 28.

The encoded compressed signal $h(\Delta_n)$, from the selected Huffman encoder is supplied to a code identification generator and insertion circuit 50 for insertion of a code word into the encoded signal stream to identify the operating state of the system. The code identification generator and insertion circuit 50 is controlled by the output from the mode control unit 24 for the generation of a code word that is unique for the energy level band of the analog input signal f(t). In the illustrated arrangement, the code word identifies the Huffman code employed by digital encoder 40. The code word may comprise a word which is not contained in any of the Huffman codes, or it may be a code word that is the same for each of the codes, but which is followed by a binary number that identifies the state. The code word is sent after a switch in the output from the mode control unit 24 and periodically thereafter in case some of the subsequently recorded bit stream is destroyed by bit errors. For example, placing an identifier in the encoded bit stream every 50 or 100 samples will identify the code every several milliseconds but cause negligible increase in the average bit length. The encode bit stream, with identifier word, is identified by $h(\Delta_n) + ID$ in the drawings.

The encoded digital data stream, with identifiers, is recorded and/or transmitted to a remote receiver. For recording, the data stream from code identification generator and insertion circuit 50 is connected through a buffer memory 52 to a recorder unit 54. Recorded encoded digital signals such as those recorded at recorder unit 54 are reproduced using the system shown in FIG. 1B, which system includes a playback unit 60.

Signals from the playback unit 60 are supplied through a buffer memory 62 to a code checker and stripper unit 64 which examines the bit stream for the identifying code word, or words. This process may be accomplished using one or more AND logic gate network means connected to a shift register through which the bit stream is passed; one logic gate network for each identifying code word. Alternatively, the code word may be identified by use of a subroutine in a microprocessor. In any case, the identifying code word is stripped from the bit stream, and the encoded compressed signals $h(\Delta_n)$ are supplied to a digital decoder 66 for decoding the same. A control signal is generated by the code checker and stripper in response to the identifying code word, which signal is connected over line 68 to the decoder 66 for control of the decoding operation.

Since the compressed signal stream is encoded using different codes, it will be apparent that the decoder 66 must be operable in different decoding modes for decoding the coded signal stream supplied thereto. The illustrated decoder is shown to include a plurality of individual decoders 66-0, 66-1 . . . and 66-N. Switches 70 and 72 at the inputs and outputs of the decoders select which decoder is employed. The switches 70 and 72 are under control of the control signal supplied thereto over line 68 from the code checker and stripper 64. The appropriate decoder unit is switched into the circuit for decoding the encoded difference signals supplied to decoder 66, dependent upon which Huffman encoder 44-0 etc. is employed during coding.

The compressed signal output $\Delta_n$ from the digital decoder 66 is supplied to a reconstruction, or decompression, filter 74 for conversion of the compressed signals to equal length sample signals $f_n(out)$. The reconstruction filter 74 is an exact, or substantially exact, inverse of the compression filter 40 for exact, or nearly exact, reconstruction of the input sample signals $f_n$ supplied to the digital compression filter 30.

A digital to analog converter (D/A converter) 76 converts the signal samples $f_n(out)$ from the digital reconstruction filter 74 to analog form. An analog high frequency emphasis filter 20A, having a frequency characteristic depicted in FIG. 2, emphasizes the high frequency components of the analog signal from the D/A converter 76 whereby the filter output closely matches the input which was supplied to the high frequency deemphasis filter 20 included in the recording section shown in FIG. 1A.

Figure 5:
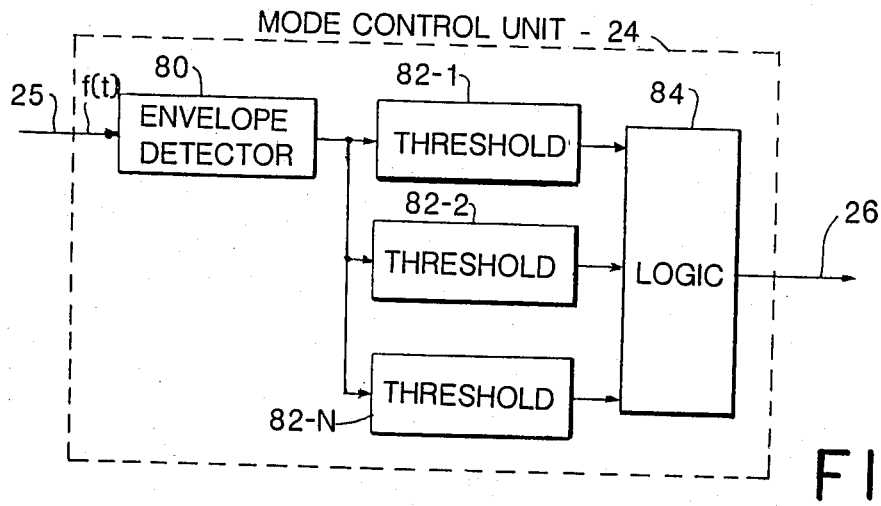
FIG. 5 is a block diagram showing details of the mode control unit shown in FIG. 1A.

Reference now is made to FIG. 5 of the drawings wherein a mode control unit 24 of the type which may be included in the recording section of FIG. 1A is shown to include an envelope detector 80 responsive to the analog music signal f(t) supplied thereto over line 25 from the high frequency deemphasis filter 20. It here will be noted that the input signal to the envelope detector may be obtained from the analog music signal at the input to the high frequency deemphasis filter 20 rather than from the filter output, if desired.

The envelope detector measures the average music energy level, and the detector output is connected to one or more threshold circuits for sensing one or more thresholds of the detector output. In FIG. 5, threshold circuits 82-1, 82-2 through 82-N are shown. The envelope detector output identified by reference character 80A, is depicted at B of FIG. 3, together with the input levels TR1, TR2 and TRN at which the threshold circuits 82-1, 82-2 and 82-N, respectively, function to produce an output.

The threshold circuit outputs are supplied to a logic unit 84 which, in turn, produces a first output when the analog input envelope equals or exceeds TR1, a second output when the envelope equals or exceeds TR2, etc. Obviously, output line 26 from the logic unit 84 may comprise a plurality of conductors over which individual control signals dependent upon the level of the analog input envelope are conducted to the various circuits to be controlled. The logic may be implemented using a logic gate network, computer subroutine, or the like.

Figures 6, 8:
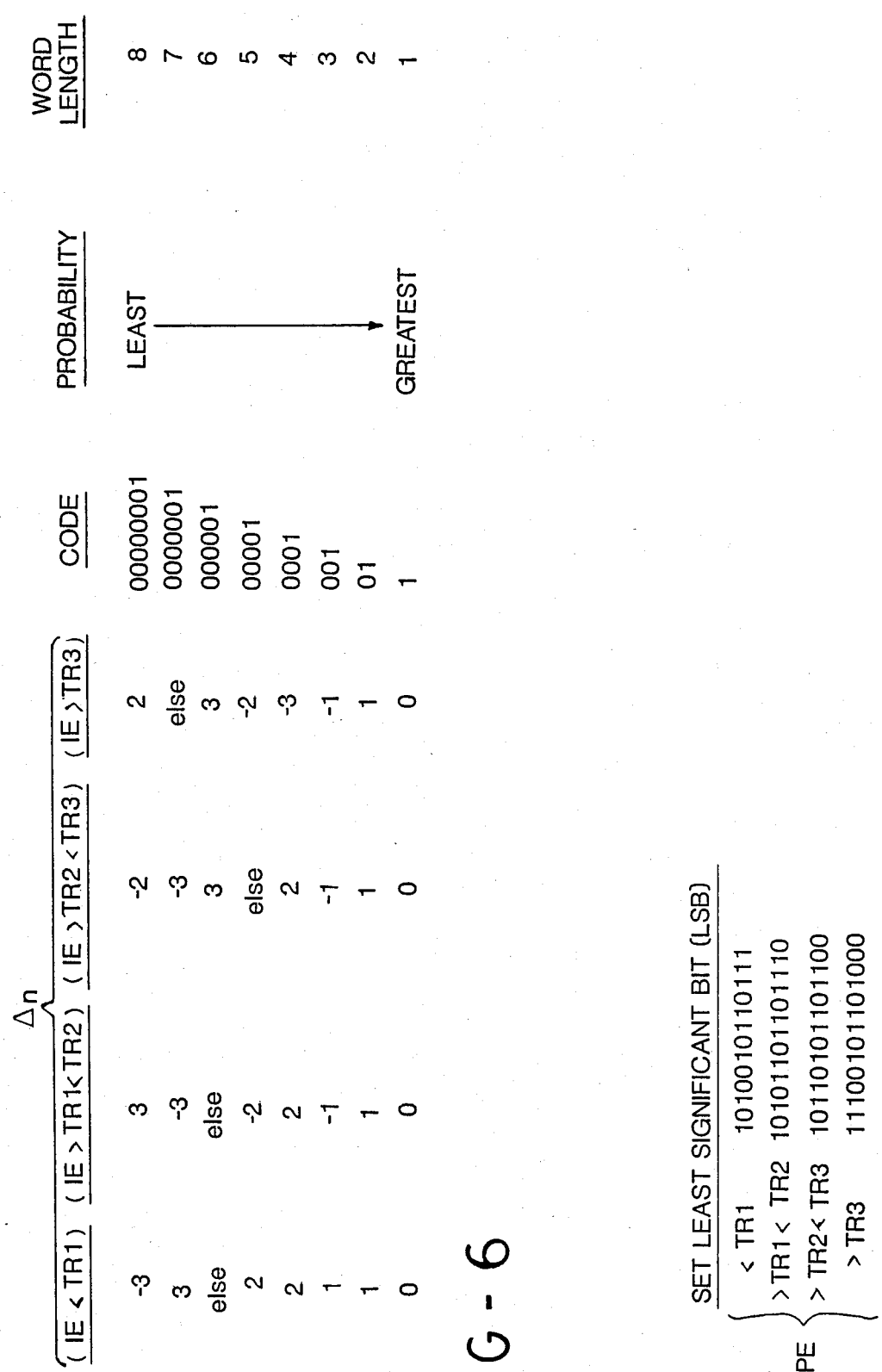
FIG. 6 is a table illustrating different truncated Huffman codes for use in the data reduction system.
FIG. 8 is a table which illustrates the setting of least significant bits of sample signals supplied to the digital compression filter.

Reference now is made to FIG. 6 which shows a table of truncated Huffman codes which may be employed in the operation of encoder 40 shown in FIG. 1A. In FIG. 6, encoding operations at four different levels of the average value of the analog input signal are illustrated wherein the input signal envelope, IE, is less than threshold TR1 (see B of FIG. 3), i.e. IE<TR1; IE>TR1<TR2; IE>TR2<TR3; and IE>TR3. The compressed signals, $\Delta_n$, which occur most frequently are assigned a code word. In the illustrated arrangement, these signals comprise values between +3 and −3. The most frequently occuring compressed signals are assigned the shortest code word. All other signals outside the range of ±3 are identified as "else" in the table, and these are assigned a code word which, as described above with reference to FIG. 4, comprise a label for the actual compressed signal value $\Delta_n$ which subsequently is recorded.

An examination of the table of FIG. 6 reveals, for example, that the signals 2, −2, 3 and −3 have the least probability of occurance during operation when IE>TR3, IE>TR2<TR3, IE>TR1<TR2, and IE<TR1, respectively. Consequently, these signals are assigned the longest code word which, in the table is 00000001. From the table, it will be apparent that a different code is employed for each operating mode, which code minimizes the average bit rate from the encoder. Obviously, the invention is not limited to the use of the illustrated codes, or to coding of the illustrated range of compressed signal values.

A brief description of the operation of the data compression system shown in FIGS. 1A and 1B and described above now will be provided. An analog music signal f(t) (A of FIG. 3) is filtered by high frequency deemphasis filter 20 to reduce the level of the high frequency components of the music signal. (See FIG. 2) The output from the filter 20 is converted to a stream of sample signals, $f_n$ by analog to digital converter 22, which sample signals are supplied to an entropy setting unit 28 comprising, for example, a register into which the sample signals are shifted and which includes means for setting one or more least significant bits of the sample signal to a predetermined value (either 0 or 1) dependent upon the output from mode control unit 24.

Mode control unit 24 is responsive to the analog music signal and includes an envelope detector and one or more threshold circuits for production of control signals dependent upon the energy level of the music signal. For a mode control unit 24 which includes three threshold circuits, a first mode control signal is produced at the output 26 thereof when the average energy level is less than threshold level TR1. Between energy levels TR1 and TR2 a second mode control signal is produced; between energy levels TR2 and TR3 a third mode control signal is produced; and above energy level TR3 a fourth mode control signal is produced.

At low music energy levels, wherein the input signal envelope, IE (B of FIG. 3) is less than the first threshold level TR1, the sample signals pass unaltered through the entropy setting unit 28 to digital compression filter 30. In this operating mode, the complete sample signal, $f_n$ is supplied to filter 30 for compression filtering thereof. The compressed signal output $\Delta_n$ from the compression filter 30 is encoded using a first truncated Huffman code provided by Huffman encoder 40-0 which is selected under control of the mode control signal from mode control unit 24.

When the music signal envelope, IE, exceeds the first threshold level TR1, a different mode control signal is generated by mode control unit 24 which operates to:

(1) set one or more of the least significant bits of the sample signal to a predetermined value at entropy setting unit 28;

(2) select a different Huffman code, such as provided by Huffman encoder 40-1, for encoding the compression signals $\Delta_n$ from compression filter 30; and (3) generate a new identifier word for insertion in the encoded signal stream.

With increases in the music energy level, above predetermined threshold levels, the more least significant bits are set to some predetermined value thereby effectively (not actually) reducing the word length of the sample signals from the analog to digital converter 22. In FIG. 8A, the setting of one, two, and three least significant bits of a word to zero dependent upon which of three thresholds are exceeded is depicted for purposes of illustration. Obviously, although truncation is illustrated in FIG. 8 for restriction of LSBs when a threshold is exceeded, it will be apparent that other means including round-off may be employed, if desired.

During playback, the encoded signal stream is searched for the identifier by the code checker and stripper 64 (FIG. 1B). From the code checker and stripper 64, the encoded signal stream is supplied to digital decoder 66 for decoding by one of the Huffman decoders 66-0 through 66-N. The decoder employed is selected under control of the code identification signal at the output line 68 from the code checker and stripper 64 for proper decoding of the encoded signal stream. From the selected decoder, the digital compressed signals $\Delta_n$ are supplied to digital reconstruction filter 74 having an output $f_n$(out) which nearly matches the input $f_n$ to the digital compression filter 30. The output from the digital reconstruction filter 74 is converted to analog form by digital to analog converter 76, and the converter output is filtered by high frequency emphasis filter 20A to restore the analog signal to one nearly matching the analog input signal to the high frequency deemphasis filter 20 in the recording section.

It now will be shown that for a single threshold the entropy at the output of the compression filter 30 is reduced by at least $P_n$, where the n least significant bits of the sample signal input to the filter are set to 0 (or to 1) when the threshold is on, and where P is the probability that the threshold is on. It here will be understood that the average word length, L, from a Huffman encoder, such as encoder 40 to which the output from compression filter 30 is supplied is bounded by $$H < L < H+1 \tag{3}$$

where H is the entropy.

The reduction in entropy can be generalized for M thresholds; the entropy being reduced by $$\sum_{L=1}^{M} P_i N_i \tag{4}$$

where $P_i$ is the probability that the ith threshold but not the $(i+1)^{th}$ threshold is on, and $N_i$ is the number of least significant bits (LSB) that are set to 0 (or to 1). However, only the single threshold proof is given hereinbelow since the notation is greatly simplified.

The average entropy, $H_a$ is $$H_a = (1-P)H_o + PH_1 \tag{5}$$

where $H_o$ is the entropy at the output of compression filter 30 when the threshold is off, P is the probability that the threshold is on, and $H_1$ is the entropy thereat with bit restriction when the threshold is on.

$$(1-P)H_o = (1-P)\sum_i P_{io} \log \frac{1}{P_{io}} \tag{6}$$

where $P_{io}$ is the probability of the $i^{th}$ value of the filter output when the threshold is off. For example, if the filter arithmetic is in 18 bits, there are $2^{18}$ possible values of filter output. Now, let $H_1'$ be the entropy at the filter output when the threshold is on but without LSB restriction.

$$PH_1' = P\sum_i P_{i1} \log \frac{1}{P_{i1}} \tag{7}$$

where $P_{i1}$ is the probability of the $i^{th}$ filter output when the threshold is on but with no LSB restriction.

The following inequality is well known. If $$x_i \geq 0 \text{ and } y_i \geq 0$$

and if $$\sum_i x_i = \sum_i y_i = 1$$

then $$\sum_i x_i \log \frac{1}{x_i} \leq \sum_i x_i \log \frac{1}{y_i} \tag{8}$$

thus $$(1-P)\sum_i P_{io} \log \frac{1}{P_{io}} \leq \sum_i (1-P)P_{io} \log \frac{1}{(1-P)P_{io}+PP_{i1}} \tag{9}$$

and $$P\sum_i P_{i1} \log \frac{1}{P_{i1}} \leq \sum_i PP_{i1} \log \frac{1}{(1-P)P_{io}+PP_{i1}} \tag{10}$$

then $$(1-P)H_o + PH_1' \leq \sum_i [(1-P)P_{io} + PP_{i1}] \log \frac{1}{(1-P)P_{io}+PP_{i1}} \tag{11}$$

Note that $P_{io}$ is the probability that the ith output occurs given that the average sound energy is less than a specified level and $P_{i1}$ is the probability given that the energy is above the level. Then the probability of the ith value of the filter output when there is not threshold switching, $P_i$ is $$P_i = (1-P)P_{io} + PP_{i1} \tag{12}$$

The entropy, without switching, at the filter output, H, is $$H = \sum_i P_i \log \frac{1}{P_i} \tag{13}$$

and $$(1-P)H_o + PH_1' \leq H \tag{14}$$

With a sample signal word length L, there will be $2^L$ possible outputs from the A/D converter 22, and every other possible output will end in a 1. If an LSB is changed from 1 to 0 the number will be changed to the next smallest number, and if all the LSBs that are 1 are changed to 0, the number of possible numbers will be $2^{L-1}$. The difference between any two successive numbers will double and so will the quantization level. This setting of the n LSBs to 0 (or 1) will reduce the entropy by n bits as can be seen in the following argument.

Figure 7:
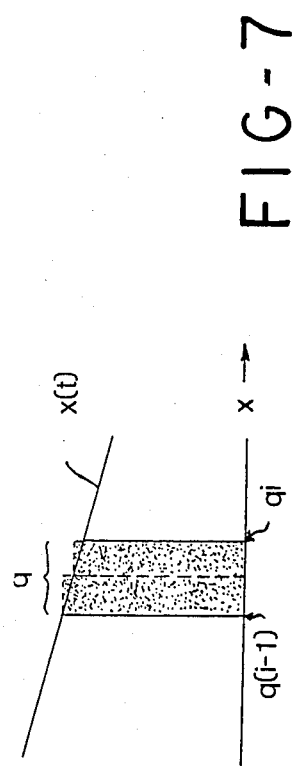
FIG. 7 is a graph for use in showing the relationship between the probability that a digital sample signal value will occur within a certain quantization level and size of the quantization level.

The entropy of a binary analog to digital (A/D) converted N bit long sample is $$H(q) = \sum_{i=1}^{2^N} -P_i \log_2 P_i \tag{15}$$

where there are $2^N$ possible values of the sample and $P_i$ is the probability that the ith possible value will occur. Let the size of the quantization level be q and, for simplicity, assume that the ith quantization, which gives the ith value, is from $q(i-1)$ to qi. Then, as seen in FIG. 7, the signal before A/D conversion will fall in the range of $q(i-1)$ to iq. In FIG. 7, the shaded area is the probability that the signal, x(t) falls into the ith quantization.

Now, assume further that the size of the quantization level, q, is small compared to the standard deviation, $\sigma$, of the signal. If the A/D converter word length is increased by one bit, the quantization size is cut in half and, as shown by dashed lines in FIG. 7, two quantization bins are formed from the original. For q small, the areas on either side of the dashed line will be almost equal and the probability that x(t) will fall into one of the two new bins is approximately $P_i/2$. Therefore, the contribution of the two new bins to the entropy of the n+1 bit long word very nearly is $$-2\left[\frac{P_i}{2} \log_2 \frac{P_i}{2}\right] = -2\left[\frac{P_i}{2}(\log_2 P_i - 1)\right] \tag{16}$$
$$= -P_i \log_2 P_i + P_i$$

The entropy of the (n+1) bit long word is $$H\left(\frac{q}{2}\right) = \sum_{i=1}^{2^N} -P_i \log_2 P_i + \sum_{i=1}^{2^N} P_i = H(q) + 1. \tag{17}$$

From the above, it will be seen that, as the bit length is increased, the increase in entropy will converge to one bit for each bit added to the word length. The argument when the first quantization bin is centered about zero (the usual case) is slightly more complex, however, the result is the same.

Thus $$H_1 = H_1' - n \tag{18}$$

then $$(1-P)H_o + PH_1' = Pn + H_a \tag{19}$$

and, using equation (11), $$H \geq Pn + H_a \tag{20}$$

or $$H - Pn \geqq H_a \tag{21}$$

which shows that the entropy with least significant bit restriction is less than the average entropy without bit restriction.

Figure 9:
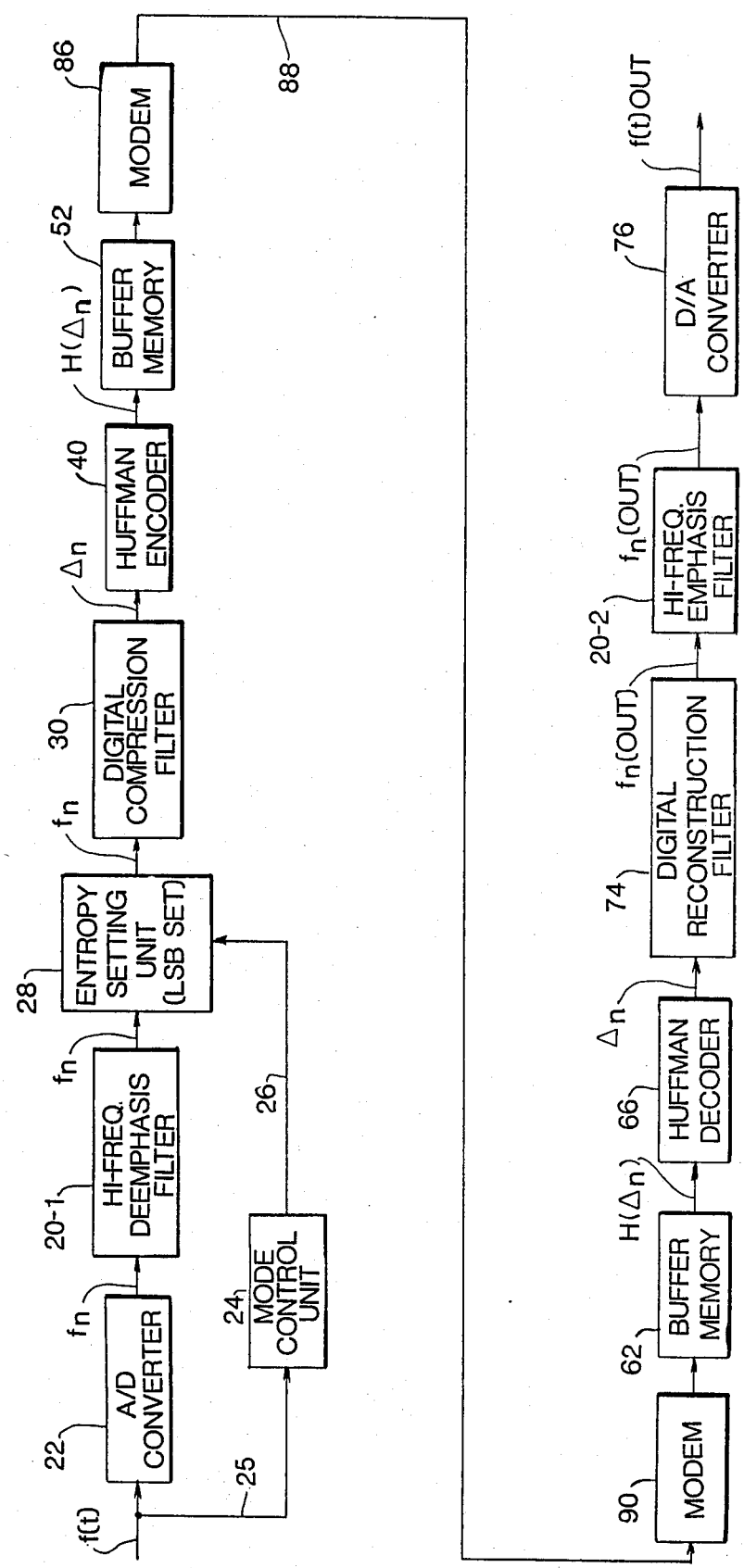
FIG. 9 is a block diagram of a modified form of data reduction system which is similar to that shown in FIGS. 1A and 1B but which employs a single truncated Huffman code.

From the above, it will be apparent that entropy reduction may be obtained by a system similar to that of FIGS. 1A and 1B but without the need for different Huffman encoding of the compressed signals $\Delta_n$. Such a system which operates with a single Huffman encoder/decoder and without the need for a code identifier word in the encoded compressed signal stream, is shown in FIG. 9 to which figure reference now is made. There, the simplified system is shown comprising analog to digital converter means 22 to which the analog music signal, f(t), is supplied for conversion to digital form. A digital high frequency deemphasis filter 20-1 is included in the connection of the sample signal output, $f_n$, from the analog to digital converter to the input of entropy setting unit 28. As described above, entropy setting unit 28 is adapted for setting one or more least significant bits of the sample signal to a predetermined value when one or more threshold values of the input signal envelope exceed predetermined levels. A mode control unit 24, responsive to the analog input signal, controls the setting of the least significant bit(s), which mode control unit may be of the same construction as shown in FIG. 5 and described above.

The sample signal output from the entropy setting means 28 is compression filtered by compression filter 30, truncated Huffman encoded by encoder 40 and supplied through buffer memory 52 to a modem 86 for transmission over communications link 88 to a modem 90 at a receiving station. There, the signal is fed through buffer memory 62 to Huffman decoder 66 for decoding the same. The compressed signal output from the Huffman decoder 66 is filtered by reconstruction filter 74 having an output which substantially corresponds to the input to the digital compression filter 30. A high frequency emphasis filter 20-2 boosts the high frequency components of the output, $f_n$(out) from the reconstruction filter 74, and the output from filter 20-2 is converted to digital form by digital to analog converter 76.

With the arrangement of FIG. 9, input least significant bits to the digital compression filter are restricted in the manner described above with reference to FIG. 1A. When n least significant bits are set to 0 (or to 1) the number of possible compression filter input values is reduced by a factor of $2^n$ numbers. Thus the $2^{L-n}$ values will have a higher probability mass which reduces the entropy over that of a probability distribution that is not conditioned on the threshold state of the music signal envelope. A single truncated Huffman code is derived for this distribution for use by Huffman encoder 40, for a reduction in the average word length from the Huffman encoder. A bound for the entropy, $H_+$, is:

$$H_+ \leqq H - Pn + P \log \frac{1}{P} + (1 - P) \log \frac{1}{1 - P} \tag{22}$$

This is a higher bound than equation 21 but close thereto when P is near 1. Experiment has shown that the actual entropy with the single Huffman code embodiment of FIG. 9 is significantly greater than the multiple code embodiment of FIGS. 1A and 1B. However, the FIG. 9 embodiment is easier to implement and is of value since it does provide for a reduction in entropy.

Figure 10A:
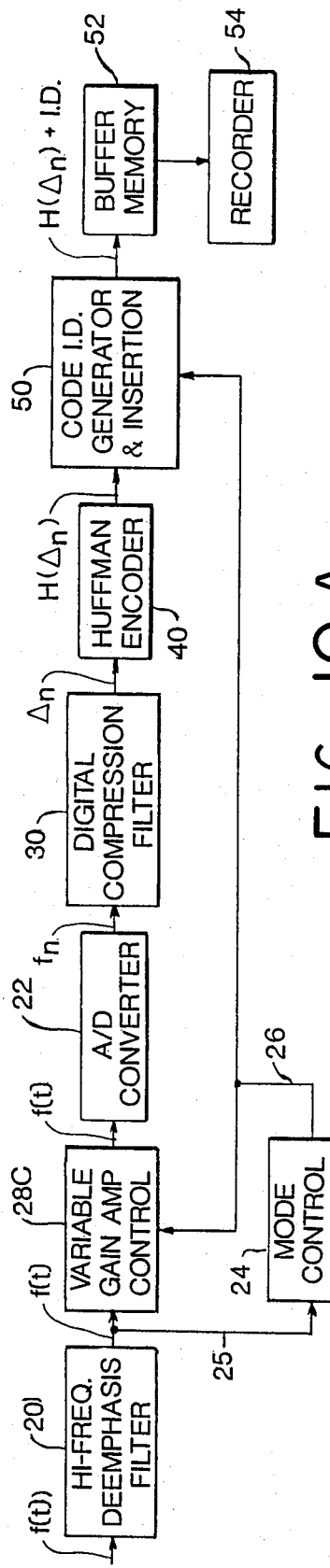
FIGS. 10A and 10B together show a block diagram of a modified form of data reduction system which includes gain setting means instead of the least significant bit setting means employed in the embodiment of FIGS. 1A and 1B.

Referring now to FIG. 10A, the recording section is shown to include a high frequency deemphasis filter 20 to which the analog music signal is supplied. The output from the high frequency deemphasis filter 20 is supplied to a variable gain amplifier 28C, in which the amplifier gain is set, in steps, under control of the output from mode control unit 24 at line 26. The mode control unit 24, which is responsive to the analog music signal f(t) from the high frequency deemphasis filter 20 may be of the same type as shown in FIG. 5 and described above. At one or more predetermined threshold levels of the music signal envelope, the output from the mode control unit 24 serves to change the gain of the variable gain amplifier, the amplifier gain being reduced in steps as increasingly higher threshold levels of the analog music energy are reached.

The analog output signal from the variable gain amplifier is converted to digital form by analog to digital converter 22, and the digital sample signal from A/D converter 22 is compression filtered by compression filter 30. The compressed signal output, $\Delta_n$ from the digital compression filter 30 is encoded at Huffman encoder 40 which implements a single truncated Huffman code. A code word is inserted in the Huffman encoded signal stream from encoder 40 by the code identification generation and insertion circuit 50 which circuit, as in other arrangements, is controlled by the output from the mode control unit 24. Here, the code word identifies the gain setting of variable gain amplifier 28C. The Huffman encoded signal stream, with the code word inserted therein at changes in the gain setting, and periodically thereafter, is supplied through buffer memory 52 to the recorder 54 for recording thereof.

Figure 10B:
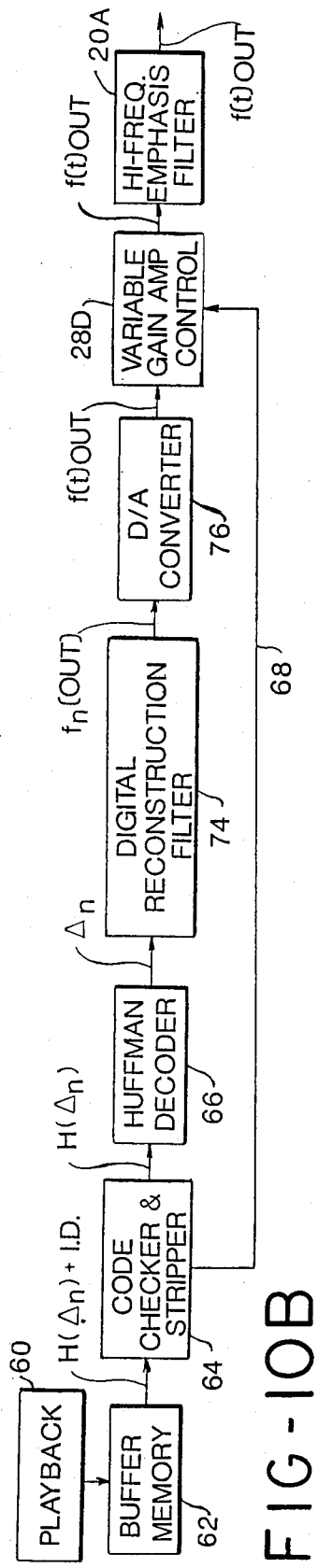

The playback section shown in FIG. 10B, includes a playback unit 60, buffer memory 62, Huffman decoder 66, digital reconstruction filter 74 and D/A converter 76 all of which are of the same type as described above. In FIG. 10B, an analog variable gain circuit 28D is included in the output from the D/A converter 76 to restore the strength of the signal thereat to a level substantially corresponding to that at the input to variable gain amplifier 28C in the recording section when a decrease has been provided during recording. The control signal at line 68 from the code checker and stripper circuit 64 controls the gain setting of variable gain amplifier 28D in accordance with the code word contained in the digital signal stream at the input to the code checker and stripper circuit. The gain is changed, in steps, with changes in the code word. Obviously, digital gain control means for controlling the gain of the output from digital reconstruction filter means 74, before digital to analog conversion by D/A converter 76, may be used so long as corresponding inverse gain settings of variable gain amplifier 28C are employed during recording.

Figure 11:
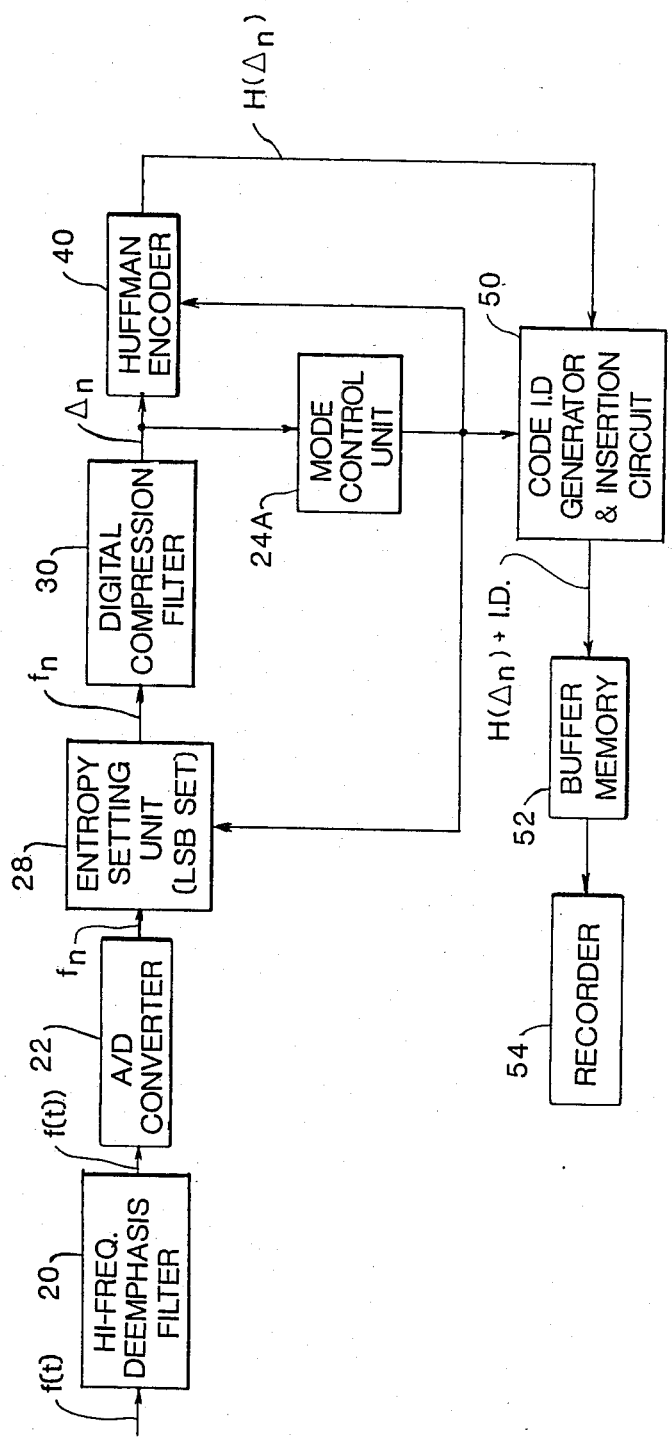
FIG. 11 is a block diagram of yet another modified form of a digital data recording system which embodies the present invention in which the mode control unit is responsive to the output from the digital compression filter means.

In yet another modified form of this invention, shown in FIG. 11, a mode control unit responsive to the output from the digital compression filter 30 is employed. There, the data compression system is shown to include: a high frequency deemphasis filter 20 to which the analog music signal, f(t), is supplied; an analog to digital converter 22 for converting the analog signal output from the filter 20 to digital form; an entropy setting unit 28 for use in setting one or more least significant bits of the A/D converter output to a predetermined value; a digital compression filter 30 for compression of the signal; a Huffman encoder 40 for truncated Huffman encoding of the compressed signal; a code identification generator and insertion circuit 50 for inserting an identifying code word in the encoded compressed signal stream to identify the setting of entropy control unit 28; and a buffer memory 52 and recorder 54 for recording the signal stream from the code identification generator and insertion circuit 50; all of which elements may be of the same type as shown in FIG. 1A and described above.

The music data compression system of FIG. 11 includes a mode control unit 24A which is responsive to the output from the compression filter 30 rather than to the input to the compression filter. Outputs from the mode control unit 24A are supplied to the entropy setting unit 28 for setting one or more least significant bits of the sample signal to a predetermined value; to the Huffman encoder 40 for selecting a Huffman code; and to the I.D. generator and insertion circuit 50 for generating an identification word for insertion in the encoded signal stream.

In the FIG. 11 arrangement, the mode control unit 24A comprises an envelope detector and a set of thresholds, in the manner shown in FIG. 5. The envelope detector of mode control unit 24A is implemented digitally using the following equation $$Y_n = \alpha(\Delta_n)^2 + (1-\alpha)Y_{n-1} \qquad (23)$$

where $Y_n$ is the present value of the detector output, $Y_{n-1}$ is the previous detector output, and $\alpha$ is a constant such that $0 < \alpha < 1$.

There is a set of numbers, $T_1, T_2, \ldots, T_n$ that set the threshold levels. For example, if $Y_n$ is less than $T_3$ the two LSBs would be set to zero (or one). The quantity $Y_n$ is an estimate of the average power of the $\Delta_n$.

That a measure of the power of the compression filter output, $\Delta_n$, may be used to control the mode will become apparent from the following argument. It was shown earlier that if the quantization level, q (the minimum distance between the A/D converted numbers), is doubled the entropy is decreased by one bit. A digital filter 30 with finite word length coefficients will change the quantization of the output signal so that the ratio of the input quantization level to the output quantization level is a constant. Therefore, if the input quantization level is doubled so is the quantization level of the $\Delta_n$ and the entropy of the $\Delta_n$ will decrease by one bit. As an example, when the LSB is set to zero half of the original numbers can no longer occur and the minimum distance between numbers (the quantization level) at the filter 30 input and thus at the filter output will double.

To a close approximation music is a gaussian waveform so that the $f_n$ are gaussian distributed numbers. Since the compression filter is linear the $\Delta_n$ are also gaussian. A computer evaluation of the entropy of gaussian numbers shows that to a close approximation the entropy is $$H \cong 1 + \log\left(\frac{\sigma}{q}\right) \text{ bits}$$

where $\sigma$ is the standard deviation of the numbers (the standard deviation is equal to the square root of the power).

The quantization level of the $\Delta_n$ can be raised or lowered by raising or lowering the number of bits that are set to zero (or to one) to adjust $\sigma/q$ to near a designed ratio. The quantization of the $\Delta_n$ is $$q = q_0 \cdot 2^m$$

where $q_0$ is the quantization level of the $\Delta_n$ when no LSBs are set to zero (or 1) by entropy setting unit 28 and m is the number of LSBs that are fixed to zero (or one). Since $Y_n$ is the estimate of $\sigma^2$ and there is a one-to-one relationship between a positive number and its square, $Y_n$ is applied to the thresholds.

For example only, when the word length out of the A/D converter 22 is 14 bits, the possible numbers are all the integers between $-8192$ and $+8192$. If the quantization level of the $\Delta_n$ is the same as the quantization level of the $f_n$, $q_0 = 1$. If it is desired to keep the entropy near 4 bits, then log $\sigma/q \cong 3$ or $\sigma/q \cong 8$; then $Y_n/2^{2m} \cong 64$, or $Y_n \cong 2^{2m} \times 64 = 2^{2m+6}$.

The threshold numbers can be calculated using this relationship as follows:

$$T_1 = 2^{2 \times 0.5 + 6} = 128$$

$$T_2 = 2^{2 \times 1.5 + 6} = 512$$

$$T_3 = 2^{2 \times 2.5 + 6} = 2048$$

$$T_4 = 2^{2 \times 3.5 + 6} = 8196$$

$$T_5 = 2^{2 \times 4.5 + 6} = 32768$$

$$T_6 = 2^{2 \times 5.5 + 6} = 131072$$

etc. These values will keep the entropy within one bit of 4.

The remainder of the operation of the system is exactly the same as when the thresholds on the input signal envelope detector set the number of bits that are set to zero (or to 1), as shown in FIGS. 1A and 1B and described in detail above.

The entropy setting unit 28C of the variable gain type (shown in FIG. 10A) can also be operated by mode control unit 24A instead of by mode control unit 24, in which case the gain is cut in half each time the next largest threshold is exceeded by $Y_n$. For example, a mode control 24A responsive to the output from digital compression filter 30 may be used in place of mode control unit 24 in the arrangement shown in FIG. 10A, in which case the system shown in FIGS. 10A and 10B would operate in the same manner as described above except that the output from a mode control unit 24A would be employed for control of entropy setting unit 28C and code I.D. generator and insertion circuit 50. In summary, it will be seen that either the quantization level, q, of the digital sample signals from the A/D converter 22 is controlled by entropy setting unit 28 in the arrangements of FIGS. 1A, 9 and 11, or the standard deviation, $\sigma$, of the compressed signal stream from the digital compression filter means 30 is controlled by entropy setting unit 28C in the FIG. 10A arrangement. Either the quantization level, q, or the standard deviation, $\sigma$, is controlled in a particular system but not both factors. When either q or $\sigma$ is changed, it is changed by a factor of $2^x$, where x is a non-zero integer. For example, each time q is doubled, or $\sigma$ is halved, the entropy of the signal stream from the digital compression filter 30 is decreased by one bit which, then, allows for a reduced bit rate at the output from the variable word length encoder 40. Since only q or σ is changed in a particular system the ratio σ/q also is changed by a factor of $2^x$ with each change in energy level band as measured by mode control unit 24 in the FIGS. 1A, 9 and 10A arrangements or the mode control unit 24A in the FIG. 11 arrangement.

The invention having been described in detail, various other changes and modifications will suggest themselves to those skilled in this art. For example, the identifying code word in the signal stream may be of a type which is suitable for decoding by the Huffman decoder 66, which signal is used for switching to the required Huffman decoder for implementing the required decoding algorithm, and for setting of the gain of the output from the reconstruction filter in the gain setting embodiments. Also, the system may include a digital computer, such as a microcomputer, for use in implementing functions of some of the elements of the system using suitable computer routines. If desired, the envelope detector and threshold functions of mode control unit 24 may be digitally implemented following analog to digital conversion of the analog input signal. It is intended that the above and other such changes and modifications shall fall within the spirit and scope of the invention as defined in the appended claims.

We claim:

1. In a data reduction system of the type for preparing varying average energy level analog input signals for storage or transmission, the combination comprising
  analog to digital converter means for converting the analog input signal to equal length digital sample signals,
  digital compression filter means responsive to digital sample signals from said analog to digital converter means for generating a stream of equal length compressed signals,
  digital encoding means implementing a truncated variable word length code for encoding the compressed signals from said digital compression filter means,
  entropy setting means for controlling the entropy of signals supplied to said digital compression filter means to control the entropy of signals from the compression filter,
  mode control means for obtaining a measure of the average energy level of the input signal prior to encoding by said digital encoding means and for producing an output indicative of an energy level band within which said signal falls, there being a plurality of different energy level bands ranging from low to high energy levels through which said signal may operate, and
  means for controlling the entropy setting means in response to the output from the mode control means for step control thereof with energy level band changes, the entropy of signals supplied to the digital compression filter means being reduced by said entropy setting means with changes from a lower to a higher energy level band and being increased with changes from a higher to a lower energy level band, the ratio σ/q being changed by a factor of $2^x$ with each change in energy level band, wherein σ is standard deviation of the compressed signal stream from the digital compression filter means, q is quantization level of the digital sample signals, and x is a non-zero integer.

2. In a data reduction system as defined in claim 1 wherein said mode control means comprises
  envelope detector means for obtaining a measure of the average energy level of the input signal, and
  threshold means responsive to the output from the envelope detector means for producing a change in the output from the mode control means when the output from the envelope detector means exceeds a threshold value of said threshold means.

3. In a data reduction system as defined in claim 1 wherein said mode control means is responsive to the input to the analog to digital converter means for obtaining a measure of the average energy level of the analog input signal to the digital converter means.

4. In a data reduction system as defined in claim 1 wherein said mode control means is responsive to the output from the analog to digital converter means for obtaining a measure of the average energy level of the digital sample signals.

5. In a data reduction system as defined in claim 1 wherein said mode control mean is responsive to the output from the digital compression filter means for obtaining a measure of the average energy level of the compressed signal stream.

6. In a data reduction system as defined in claim 1 wherein said entropy setting means comprises means for setting at least one least significant bit of the sample signal to a predetermined value with energy level changes from a lower to a higher energy level, q, band to increase the quantization level of the sample signal by a factor of $2^N$ where N is the number of least significant bits set to predetermined values.

7. In a data reduction system as defined in claim 6 wherein said mode control means comprise
  envelope detector means, and
  threshold means responsive to the output from the envelope detector means for producing a change in the output from the mode control means when the output from the envelope detector means passes through a threshold value of said threshold means.

8. In a data reduction system as defined in claim 1 wherein said digital encoding means has a plurality of operating modes for implementing a plurality of different truncated variable word length codes, and means responsive to the output from said mode control means for selecting the operating mode of the digital encoder means for operation with a code for optimum reduction in the bit rate of the encoded compressed signal output therefrom, changes in the output from the mode control means simultaneously effecting changes in the operating mode of the digital encoding means and entropy setting means.

9. In a data reduction system as defined in claim 8 including,
  means responsive to the mode control signal output from said mode control means for inserting an identifying code word in the encoded compressed stream from the digital encoding means with changes in the output from the mode control means for identifying the code being implemented by said digital encoding means.

10. In a data reduction system as defined in claim 9 including,
  means for periodically inserting said identifying code word in the encoded compressed stream after every change in the identifying code word.

11. In a data reduction system as defined in claim 9 including, code checker and stripper means for stripping the identifying code word from the encoded compressed signal stream from the digital encoder means and for producing a code identification signal corresponding to said identifying code word, digital decoder means responsive to the encoded compressed signal stream from said code checker and stripper means and having a plurality of different operating modes for decoding the different codes implemented by said digital encoding means, means responsive to the code identification signal from said code checker and stripper means for selecting the operating mode of the digital decoder means required for decoding the encoded compressed signal stream from said code checker and stripper means, and digital reconstruction filter means responsive to decoded signals from said digital decoder means for reconstruction filtering thereof.

12. In a data reduction system as defined in claim 1 wherein said entropy setting means for controlling the entropy of signals supplied to said digital compression filter means comprises gain setting means for changing the amplitude of the sample signal whenever the energy level of the input signal changes from one to another energy level band, the standard deviation, $\sigma$, of the compressed signal stream being changed by a factor of $2^x$ without a change in the quantization level of the sample signal stream by operation of said gain setting means, and means responsive to the mode control signal output from said mode control means for inserting an identifying code word in the encoded compressed signal stream from the digital encoding means with changes in the mode control signal for identifying the setting of the gain control means.

13. In a data reduction system as defined in claim 12 wherein said digital encoding means has a plurality of operating modes for implementing a plurality of different truncated variable word length codes, and means responsive to the output from the mode control means for selecting the operating mode of the digital encoder means for operation with a code which provides a reduction in the bit rate of the encoded compressed signal output therefrom.

14. In a data reduction system as defined in claim 12 wherein said digital encoding means implements a truncated Huffman code.

15. In a data reduction system as defined in claim 12 wherein said gain setting means comprises a variable gain amplifier for reducing the amplitude of the analog input signal to the analog to digital converter means with input signal energy level changes from a lower to a higher energy level band.

16. In a data reduction system as defined in claim 12 including, code checker and stripper means for stripping the identifying code word from the encoded compressed signal stream from the digital encoder means and for producing a code identification signal corresponding to said identifying code word, digital decoder means responsive to the encoded compressed signal stream from said code checker and stripper means for decoding said encoded compressed signal stream, digital reconstruction filter means responsive to decoded signals from said digital decoder means for reconstruction filtering thereof, controllable gain setting means for controlling the amplitude of the output from the digital reconstruction filter means, and having a gain which is controlled by the code identification signal from said code checker and stripper means for increasing the amplitude of the digital reconstruction filter output with input signal energy level changes from a lower to a higher energy level band.

17. In a data reduction system as defined in claim 16 wherein said digital encoding means implements a truncated Huffman code.

18. In a data reduction system as defined in claim 16 including, digital to analog converter means for converting the output from the digital reconstruction filter means to analog form, and wherein said gain setting means for controlling the entropy of signals supplied to said digital compression filter means, and said controllable gain setting means for controlling the amplitude of the output from the digital reconstruction filter means comprise variable gain amplifier means for reducing the amplitude of the analog input signal to the analog to digital converter means by a factor of $2^{-x}$ and for increasing the amplitude of the analog signal from the digital to analog converter means by a factor of $\frac{1}{2}^{-x}$, respectively, with analog input signal energy level changes from one energy level band to a higher energy level band.

19. In a data reduction system as defined in claim 1 including, high frequency deemphasis filter means for reducing the amplitude of high frequency components of digital sample signals supplied to said digital compression filter means.

20. Digital decoding and decompression means for producing digital signals $f_n$ (out) from a stream of encoded digital compressed signals, different portions of said stream having been encoded using different codes, said stream including an identifying code word at the start of each portion of the stream encoded using a different code, said digital decoder and decompression means comprising, code checker and stripper means for stripping the identifying code word from the stream of encoded compressed signals and for producing a code identification signal corresponding to said identifying code word, digital decoder means responsive to the encoded compressed signal stream from said code checker and stripper means and having a plurality of different operating modes for implementing different algorithms for decoding the different codes, means responsive to the code identification signal from said code checker and stripper means for selecting the operating mode of the digital decoder means required for decoding the encoded compressed signals from said code checker and stripper means, and means for reconstruction filtering of decoded signals from said digital decoder means for producing digital signals $f_n$(out).

21. In a data compression method for preparing analog input signals having a substantially Gaussian distribution for storage or transmission, which method includes converting the analog input signal to a digital sample signal stream of equal word length sample signals, digital compression filtering said sample signal stream for generating a stream of compressed signals of equal word length, and digital encoding the compressed signal stream to generate a stream of variable word length encoded compressed signals, the improvement including, reducing the ratio of $\sigma/q$ by a factor of $2^{-x}$ whenever the average energy level of the analog input signal exceeds a predetermined threshold level for entropy reduction of the sample signal stream, wherein $\sigma$ is standard deviation of the compressed signal stream, q is quantization level of the sample signal stream, and x is a non-zero positive integer.

22. In a data compression method as defined in claim 21 wherein the step of reducing the ratio of $\sigma/q$ comprises restricting at least one least significant bit of the sample signal to a selected value whenever the average energy level of the analog input signal exceeds a predetermined threshold level.

23. In a data compression method as defined in claim 22 which includes restricting increased numbers of least significant bits of the sample signals to selected values as the average energy level of the input signals exceeds higher predetermined threshold levels.

24. In a data compression method as defined in claim 22 which includes implementing a different code with changes in the input signal average energy levels above and below the threshold level.

25. In a data compression method as defined in claim 24 which includes inserting an identifying code word in the encoded compressed signal stream with each change in the average energy level of input signal above and below the threshold level to identify the code implemented for use in subsequent decoding of the encoded compression signals.

26. In a data compression method as defined in claim 22 including, obtaining a measure of the average energy level of the input signal by envelope detection thereof before compression filtering.

27. In a data compression method as defined in claim 21 wherein the step of reducing the ratio of $\sigma/q$ comprises reducing the amplitude of the analog input signal by a factor of $2^{-x}$.

28. In a data compression method as defined in claim 21 which includes obtaining a measure of the average energy level of the analog input signal before digital compression filtering said sample signal stream for control of the reducing step.

29. In a data compression method as defined in claim 21 which includes obtaining a measure of the average energy level of the analog input signal following digital compression filtering before digital encoding of the comprised signal stream for control of the reducing step.

30. In a data compression method as defined in claim 21 wherein the step of digital encoding implements a truncated variable word length code.

31. In a data compression method as defined by claim 30 wherein the code comprises a truncated Huffman code.

32. In a data compression method for preparing a digital sample signal stream of equal word length sample signals including digital sample signal streams having a substantially Gaussian distribution for storage or transmission, which method includes digital compression filtering said sample signal stream for generating a stream of compressed signals, and digital encoding the compressed signal stream to generate a stream of variable word length encoded compressed signals, the improvement including, restricting one or more least significant bits of the sample signals before compression filtering thereof to selected values whenever the average energy level of the signal stream before digital encoding thereof exceeds a predetermined threshold level for entropy reduction thereof.

33. In a data compression method as defined in claim 32 which includes restricting increased numbers of least significant bits of the sample signals to selected as the average energy level of the signal stream before digital encoding exceeds higher predetermined threshold levels.

34. In a data compression method as defined in claim 32 which includes implementing a different truncated variable word length code with changes in the compressed signal stream average energy levels above and below threshold level.

35. In a data compression method as defined in claim 34 which includes inserting an identifying code word in the encoded compressed signal stream with each change in the average energy level of the compressed signal stream above and below the threshold level to identify the code implemented for use in subsequent decoding of the encoded compression signals.

36. In a data compression method as defined in claim 34 wherein the code comprises a truncated Huffman code.

37. In a data compression method as defined in claim 32 which includes obtaining a measure of the average energy level of the signal stream before digital compression filtering thereof for controlling the restricting step.

38. In a data compression method as defined in claim 32 which includes obtaining a measure of the average energy level of the signal stream after digital compression filtering thereof for controlling the restricting step.

39. In a data compression method as defined in claim 32 wherein the restricting step comprises truncation of sample signals before compression filtering thereof.

40. In a data compression method for preparing analog input signals including those having a substantially Gaussian distribution for storage or transmission, which method includes converting the analog input signal to a digital sample signal stream, digital compression filtering said sample signal stream for generating a stream of compressed signals, and digital encoding the compressed signal stream using a truncated variable word length code to generate a stream of variable word length encoded compressed signals, the improvement comprising, changing the amplitude of the analog input signal by a factor of $2^x$, where x is a non-zero integer whenever the average energy of the analog input signal crosses a predetermined threshold level for changing the entropy thereof, and inserting an identifying code word in the encoded compressed signal stream with each change in the average energy of the analog input signal above and below the threshold level to identify the magnitude of the amplitude reduction.

41. In a data compression method as defined in claim 40 wherein the step of changing the amplitude of the digital sample signal stream includes controlling the amplitude of the analog input signal by means of a variable gain amplifier.

42. In a data compression method as defined in claim 40 including inserting said identifying code word in the encoded signal stream periodically after each change in the average energy of the analog input signal above and below the threshold level.

43. In a data reduction system of the type for preparing a digital sample signal stream of equal word length sample signals for storage or transmission,
  digital compression filter means for compression filtering the digital sample signal stream and generating a compressed signal stream of equal word length compressed signals,
  digital encoding means for encoding the compressed signal stream by use of a variable word length code, and
  means for controlling the quantization level of the digital sample signals and entropy of the sample signal stream supplied to the digital compression filter means by restricting one or more least significant bits of the digital sample signals to selected values in response to a measure of the average energy level of the digital sample signal stream above a predetermined level.

44. In a data reduction system as defined in claim 43 wherein said digital encoding means has a plurality of different operating modes for implementing a plurality of different codes, and
  means for implementing a different code with a change in the quantization level of the digital sample signals.

* * * * *